(12) United States Patent
Lee et al.

(10) Patent No.: US 6,449,165 B1
(45) Date of Patent: Sep. 10, 2002

(54) ELECTRICAL INTERCONNECTING DEVICE FOR A SEMICONDUCTOR ASSEMBLY

(75) Inventors: Sang-Don Lee, Seoul; Young-Jai Kim, Kyunggi-do, both of (KR)

(73) Assignee: Samsung Electronics Co., Ltd., Hwasung (KR)

( * ) Notice: Subject to any disclaimer, the term of this patent is extended or adjusted under 35 U.S.C. 154(b) by 0 days.

(21) Appl. No.: 09/543,595

(22) Filed: Apr. 5, 2000

(30) Foreign Application Priority Data

Apr. 7, 1999 (KR) .......................................... 99-12080

(51) Int. Cl.[7] ................................................ H05K 7/10
(52) U.S. Cl. ....................... 361/760; 361/785; 361/720; 361/789; 439/65; 439/525; 439/80; 439/638
(58) Field of Search ................................ 361/760, 761, 361/785, 787, 437, 736, 720, 713; 439/65, 74, 72, 80, 525, 711, 638

(56) References Cited

U.S. PATENT DOCUMENTS

| | | | | |
|---|---|---|---|---|
| 4,691,975 A | * | 9/1987 | Fukunaga et al. | 439/266 |
| 4,758,176 A | * | 7/1988 | Abe et al. | 439/331 |
| 4,869,674 A | * | 9/1989 | Pfaff | 439/70 |
| 4,872,850 A | * | 10/1989 | Mogi et al. | 439/264 |
| 5,228,861 A | * | 7/1993 | Grabbe | 439/66 |
| 5,443,396 A | * | 8/1995 | Tokushige | 439/266 |
| 5,810,609 A | * | 9/1998 | Faraci et al. | 439/71 |

* cited by examiner

Primary Examiner—David S. Martin
Assistant Examiner—Hung Bui
(74) Attorney, Agent, or Firm—Marger Johnson & McCollom, P.C.

(57) ABSTRACT

A test socket connecting an integrated circuit chip to a printed circuit board is disclosed. The test socket includes a horizontal upper portion connected to the integrated circuit chip, a horizontal lower portion connected to the printed circuit board, and an intermediate portion connected between the horizontal upper portion and the horizontal lower portion.

4 Claims, 4 Drawing Sheets

US 6,449,165 B1

ELECTRICAL INTERCONNECTING DEVICE FOR A SEMICONDUCTOR ASSEMBLY

FIELD OF THE INVENTION

The present invention relates broadly to the field of electrical interconnection devices, and more particularly to interconnection devices electrically connecting leads incorporated on an semiconductor assembly to printed patterns on a test board.

BACKGROUND OF THE INVENTION

Test systems for integrates circuits employ sockets for electrically connecting the integrated circuits thereto, in which leads of the integrated circuits (or device-under-test; DUT) are connected to patterns on test boards (or printed circuit boards) through the sockets. The socket must have an appropriate facility with mechanical and material characteristics so as to be available for performing repeated test operations.

While the sockets are utilized in many applications, e.g., from semiconductor chips to RF chips for communication system, an electrical characteristic of the test socket is influenced from high bandwidth frequency that is situated beyond hundreds MHz (mega hertz) to about several GHz (giga hertz), but not under tens MHz. The sensitivity of the electrical characteristic of the test socket in the high frequency acts as an important parameter determining test reliability in testing mobile communication chips such as CDMA (code division multiple access), PCS (personal communication system), and GSM (global system for mobile), and high bandwidth digital chips such as Rambus DRAMs. It is known that such an effect with the high frequency is due to parasitic constituents of itself, for instance parasitic inductance.

There has been a test socket proposed by Johnstech Co., in which the contact length is designed to be short so as to reduce parasitic inductance, but it has high cost for test with mass production. While, almost all of the test sockets have a longer contact length than the Johnstech's in order to promote a function for the repeated test operations.

SUMMARY OF THE INVENTION

The present invention is intended to solve the problems. And, it is an object of the invention to provide a test socket with parasitic components therewith that are more reduced than ever before.

In order to accomplish the object, a test socket includes a horizontal upper portion connected to the integrated circuit chip, a horizontal lower portion connected to the printed circuit board; and an intermediate portion connected between the horizontal upper portion and the horizontal lower portion.

BRIEF DESCRIPTION OF THE DRAWINGS

For a better understanding of the invention, and to show how embodiments of the same may be carried into effect, reference will now be made, by way of example, to the accompanying diagrammatic drawings, in which.

In the figures, like reference numerals denote like or corresponding parts.

DETAILED DESCRIPTION OF PREFERRED EMBODIMENTS

Herein below, applicable embodiments of the invention will be as follows, with the appended drawings.

Figure 1:
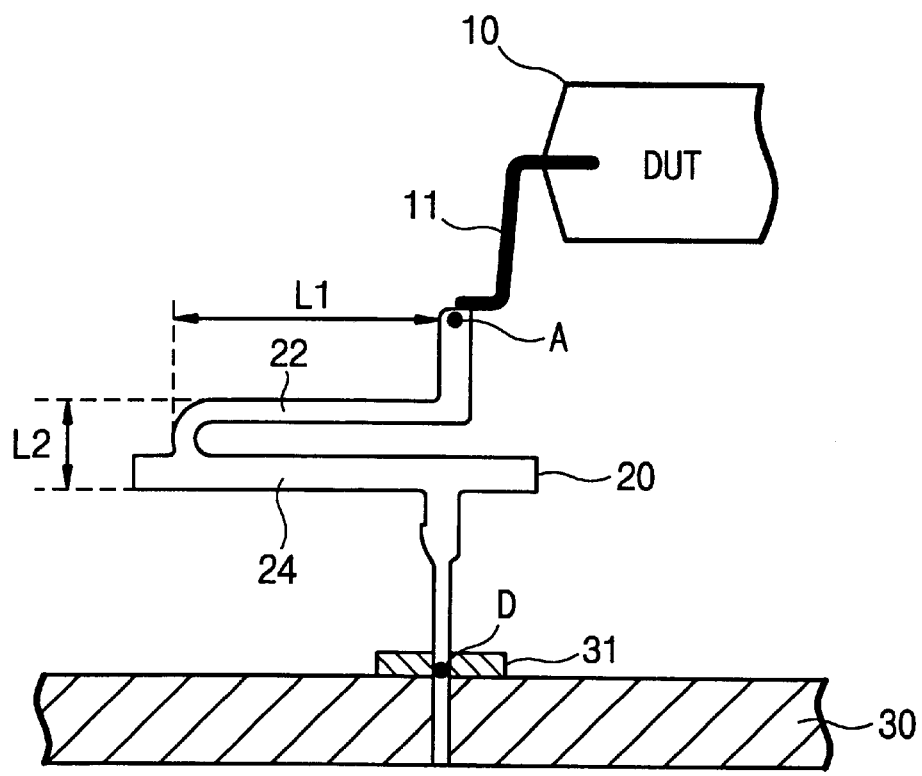
FIG. 1 is an enlarged side elevation view showing a test socket according to a first embodiment of the invention.

FIG. 1 shows a practical contact construction of a test socket, as a first embodiment, which is formed of single conduction path. Referring to FIG. 1, Socket 20 connects lead 11 of DUT (e.g., an integrated circuit chip) 10 to pattern 31 on test board 30. The shape of the socket 20 is folded at one side between contact positions A and D.

During test, current throughout the socket 20 (or the contact) flows from the contact position A to the contact position D, through upper portion 22 and under portion 24. At this time, the direction of the current flowing through the upper portion 22 (the "first current") is opposite to that flowing through the under portion 24 (the "second current"). Hence, the magnetic fields between the upper and lower portions are formed in the condition of an offset, so that parasitic components such a parasitic inductance induced from the magnetic field is reduced thereby. The horizontal length L1 and the vertical length L2 are 4 mm and 2 mm, respectively, and the mean value of the sectional width of the contact structure with the socket 20 is 04×0.15 mm$^2$. And, the socket 20 may be made of, e.g., Beryllium Copper (BeCu).

Figure 2A:
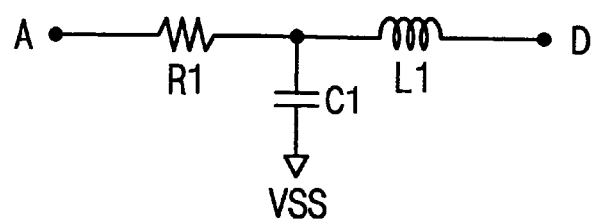
FIGS. 2A through 2C shows an electrical characteristic of the test socket shown in FIG. 1.
Figure 2B:
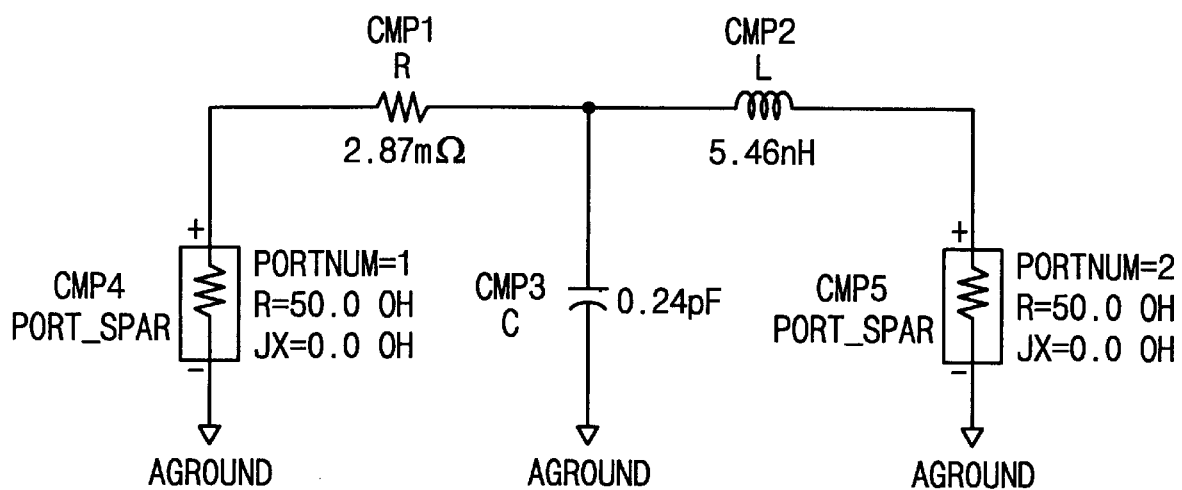
Figure 2C:
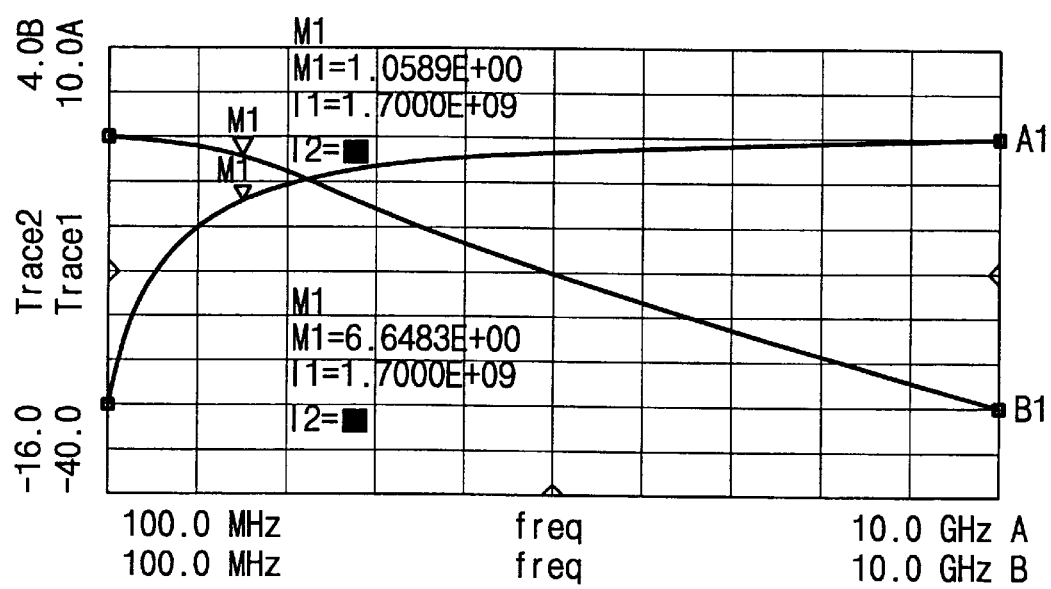

Referring to FIGS. 2A through 2C showing electrically equivalent and transconductance models, of the socket 20 (i.e., the single conduction path), the impedance Z with parasitic components, R (resistance), L (inductance), and C (capacitance), throughout the socket 20, may be summarized in:

$$Z=R+jXL \quad (1)$$

$$XL=wL=2\pi fL \quad (2)$$

Where XL is reactance, and f is frequency.

The resistance R and the inductance L are made from the characteristic of the socket with its own, and the capacitance C is considered with regarding the test board 30 to a ground. Considering the contact architecture with an RLC model of the parasitic components that are arranged by the numerical analysis, as shown in FIG. 2B, the resistance, the inductance, and the capacitance will be 2.87 mΩ, 5.46 nH (nano Hertz), and 0.24 pF (pico Farad), respectively. In addition, by the result of calculating the transconductance characteristic of the contact architecture of FIG. 1, as shown in FIG. 2C, it is available to cover a signal whose band width is up to 1.7 GHz in reference to the insertion loss S21 of −1.1 dB and the return loss of −6.6 dB.

Figure 3:
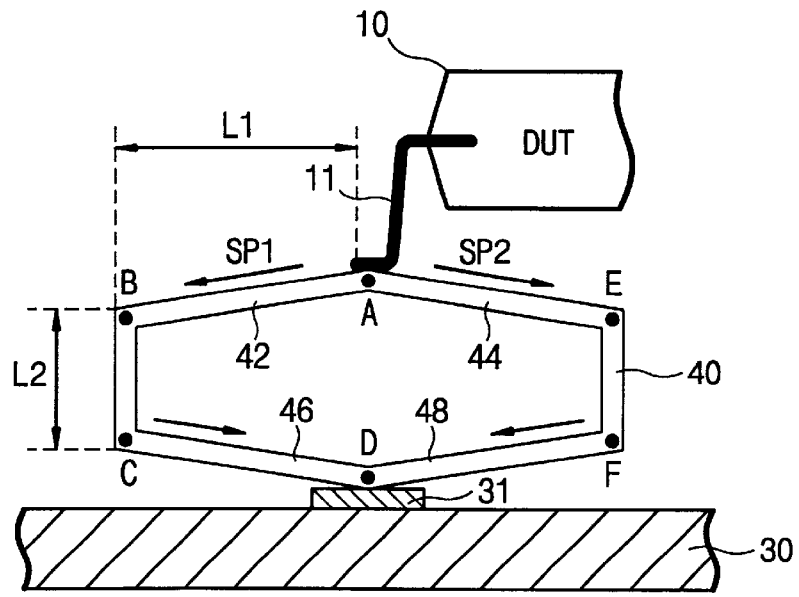
FIG. 3 is an enlarged side elevation view showing a test socket according to a second embodiment of the invention.

Now, referring to FIG. 3, the present contact architecture may be also formed of a double conduction path in order to reduce an influence by the parasitic components assigned to the test socket. As shown in FIG. 3, test socket 40 is constructed of a closed type (while the socket of FIG. 1 is an open folded type) as two single conduction sockets (like the socket 20 of FIG. 1) are combined therewith. Signal paths SP1 and SP2 are divided at the contact position A and then meet at the contact position D. The current of the signal path SP1 passes through positions B and C from A to D, and the current of the signal path SP2 through positions E and F from A to D. Both in the signal paths SP1 and SP2, the horizontal current directions (the "first current") on upper portions 42 and 44 are opposite to those of under portions 46 and 48, respectively (the "second current"). Therefore, it can be well known, as is in the FIG. 1, that the parasitic inductance therein is reduced by the offset effect. The test socket 40 is made of a conductive material that also has elasticity, such as Beryllium Copper (BeCu).

Figure 4A:
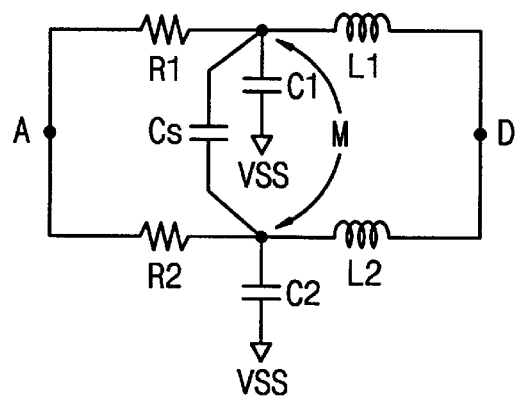
FIGS. 4A and 4D show an electrical characteristic of the test socket shown in FIG. 3.
Figure 4B:
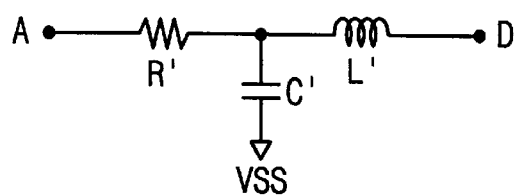

The electrically equivalent circuit model of the contact arrangement with the test socket 40 may be formed of two loops of the single conduction path, R1, R2, L1, L2, C1, and C2, and of mutual capacitance Cs between the positions A and D, as shown in FIG. 4A. And, with reference to the model of FIG. 4A, the resulting RLC circuit model is simplified as shown in FIG. 4B, and the impedance Z' with the sum parasitic resistance R', sum parasitic inductance L', and sum parasitic capacitance C', throughout the socket 20, may be summarized in:

$$Z'=R'+jXL' \qquad (1)$$

$$XL'=wL'=2\pi fL' \qquad (2)$$

Where XL' is reactance, and f is frequency.

Figure 4C:
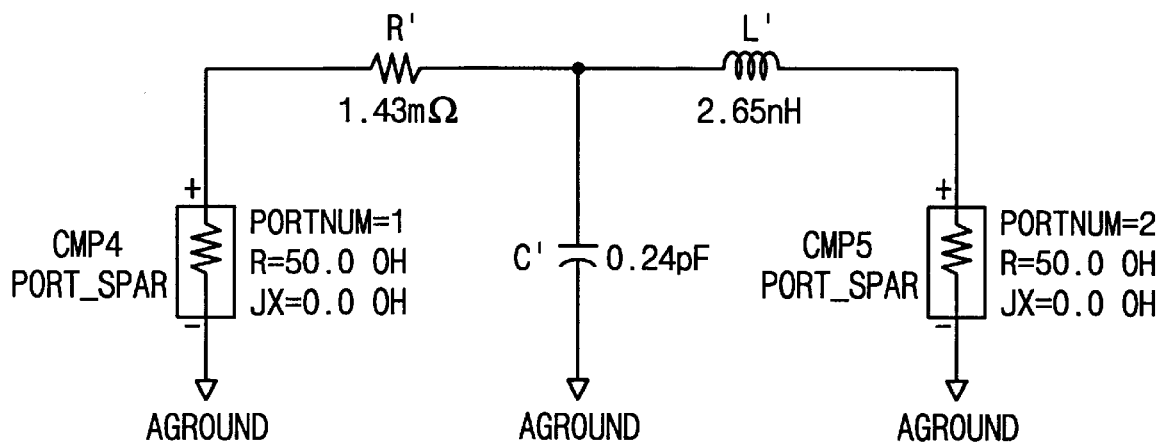
Figure 4D:
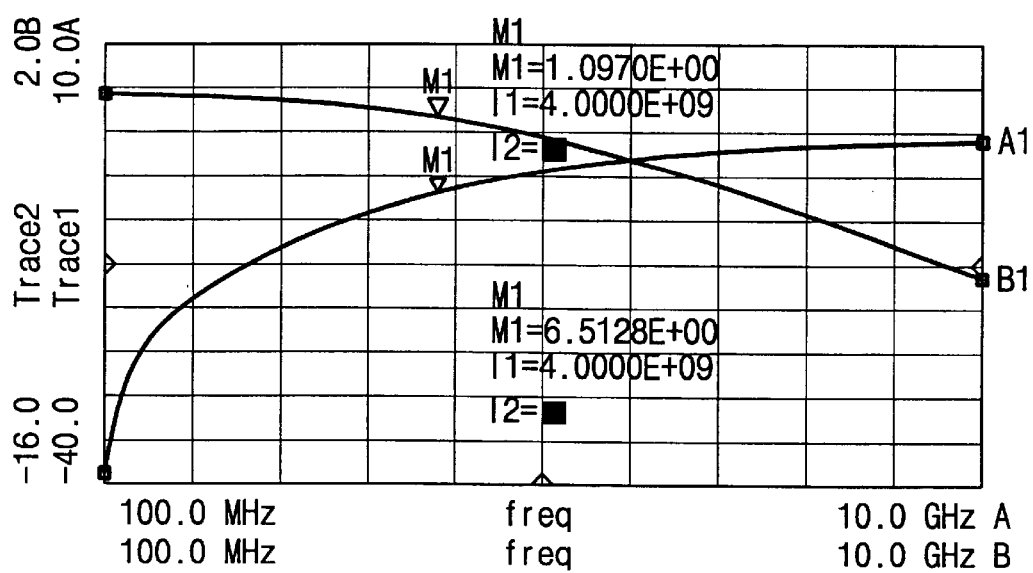

The resistance R' and the inductance L' are made from the characteristic of the socket with its own, and the capacitance C' is considered with regarding the test board 30 to a ground. Considering the contact architecture with an R'L'C' model of the parasitic components that are arranged by the numerical analysis, as shown in FIG. 4C, the resistance, the inductance, and the capacitance will be 1.43 mΩ, 2.65 nH, and 0.24 pF, respectively. In addition, by the result of calculating the transconductance characteristic of the contact architecture of FIG. 1, as shown in FIG. 4D, it is available to cover a signal whose band width is up to 4 GHz in reference to the insertion loss S21 of −1.1 dB and the return loss of −6.6 dB.

Around the embodiments aforementioned, it should be considered to accomplish the most useful contact architecture that the horizontal length L1 (in FIG. 1 or FIG. 3) mainly contributes to reducing the overall length of the contact while the vertical length L2 to degrading the parasitic components. Thus, it may be understood by an ordinary skill that variable modifications are available in order to enhance an immunity against the parasitic parameters on the contact structure using the test socket according to the invention.

What is claimed is:

1. A test socket connecting an integrated circuit chip to a printed circuit board, comprising:

a horizontal upper portion connected to the integrated circuit chip;

a horizontal lower portion connected to the printed circuit board;

a first intermediate portion connecting the horizontal upper portion to the horizontal lower portion, where the connection is at a first outer extremity of the horizontal upper and lower portions; and a second intermediate portion connecting the horizontal upper portion to the horizontal lower portion, whereby the second intermediate portion is parallel to and symmetrical with the first intermediate portion, and the connection is at a second outer extremity of the horizontal upper and lower portions.

2. A test socket according to claim 1, in which said test socket is a conductive material.

3. A test socket according to claim 2, in which said test socket is made of Beryllium Copper (BeCu).

4. A test socket according to claim 1, in which said test socket is supplied with a first current and said test socket is supplied with a second, opposite current.

\* \* \* \* \*